United States Patent [19]

Huang et al.

[11] Patent Number: 5,849,360
[45] Date of Patent: Dec. 15, 1998

[54] TUBE CHEMICAL GAS DEPOSITION METHOD OF PREPARING TITANIUM NITRIDE COATED TITANIUM CARBIDE FOR TITANIUM CARBIDE/SILICON NITRIDE COMPOSITES

[75] Inventors: Jow-Lay Huang; Ming-Tung Lee, both of Tainan, Taiwan

[73] Assignee: National Science Council, Taipei, Taiwan

[21] Appl. No.: 670,259

[22] Filed: Jun. 20, 1996

[51] Int. Cl.$^6$ .............................. C23C 16/34; B05D 3/02
[52] U.S. Cl. .................... 427/255.1; 427/215; 427/397.7
[58] Field of Search .............................. 427/255.1, 255.2, 427/215, 397.7

[56] References Cited

U.S. PATENT DOCUMENTS

| | | | |
|---|---|---|---|
| 3,807,008 | 4/1974 | Reedy, Jr. ................................ | 427/249 |
| 3,959,557 | 5/1976 | Berry ...................................... | 427/249 |
| 4,150,195 | 4/1979 | Tobioka et al. ......................... | 428/565 |
| 4,442,169 | 4/1984 | Graham .................................. | 427/253 |
| 4,810,530 | 3/1989 | D'Angelo et al. .................... | 427/255.2 |
| 4,830,886 | 5/1989 | Cho et al. ............................. | 427/255.2 |

*Primary Examiner*—Shrive Beck
*Assistant Examiner*—Bret Chen
*Attorney, Agent, or Firm*—Beveridge, DeGrandi, Weilacher & Young, LLP

[57] ABSTRACT

A tube chemical vapor deposition method of preparing titanium carbide/silicon nitride ($TiC/Si_3N_4$) composites. To prepare such composites, titanium carbide (TiC) is first coated with a homogeneous layer of titanium nitride ($Ti_3N_4$). A gas mixture of titanium chloride ($TiCl_4$), nitrogen ($N_2$), hydrogen ($H_2$) with an appropriate ratio is introduced into a reaction chamber where the tube chemical vapor deposition takes place. The temperature of the reaction for the sintering process is between 900° C. to 1200° C., under a total pressure of 1 atm. While maintaining a constant temperature for 1 to 2 hours, deposition of titanium nitride ($Ti_3N_4$) onto titanium carbide (TiC) powder takes place. The adoption of the simple tube chemical vapor deposition technique for the present invention not only enables a mass production of homogeneously coated titanium carbide (TiC) particulates, but also further enhances the hardness and toughness as well as other mechanical properties of silicon based composites, such as a titanium carbide/silicon nitride ($TiC/Si_3N_4$) composite.

3 Claims, 12 Drawing Sheets

TUBE CHEMICAL GAS DEPOSITION METHOD OF PREPARING TITANIUM NITRIDE COATED TITANIUM CARBIDE FOR TITANIUM CARBIDE/SILICON NITRIDE COMPOSITES

BACKGROUND OF THE INVENTION

Silicon nitride ($Si_3N_4$) based ceramics have outstanding physical and mechanical properties, such as wear resistance and high themal resistance at elevated temperatures. They are used extensively in commercial cutting tools, durable shafts, and as elements of inner pads of a motor engine. Other ceramics such as titanium carbide (TiC) are also useful. Titanium carbide can be used as a cutting tool material owing to its high melting point, excellent hardness, high chemical stability, and high resistance to abrasive wear mechanical properties. For these reasons, titanium carbide/silicon nitride ($TiC/Si_3N_4$) composite ceramic is a type of potential and attractive ceramic material for the future. As revealed by Martin, C. in 1988, *Material Science and Engineering*, issue A109, from pages 351 to 356, titanium carbide/silicon nitride composite ceramic had a low heat expansion constant, very high strength, and good fracture toughness. This type of composite ceramic was excellent for use as cutting tools. Titanium carbide/silicon nitride composite ceramics also have good electrical conductivity. By means of electric discharge machining technique, a variety of shapes of ceramics can be manufactured at very low cost. This application significantly enhances the potential future of silicon nitride/titanium carbide composite ceramics.

Silicon nitride based ceramics can increase 40% to 50% of fracture resistance, and change the strength by adding titanium carbide. The mechanism is owing to the reduction of crack deflection and the change of crack propagation phenomena. However, during the sintered process, titanium carbide (TiC) reacts with silicon nitride to form a porous surface, in a decrease of density of sintered bodies. The hardness, fracture resistance, and thermal stability at elevated temperatures are also decreased. According to a paper revealed by the inventor of this type of ceramic in 1994 *J. Am. Ceram. Soc.* volume 77, issue 3, from pages 705 to 710, reporting that a $TiC_{1-x}N_x$ composite ceramic could be formed by reacting titanium carbide and silicon nitride ($Si_3N_4$). From the calculation of heat thermodynamics, the nitrogen required could be obtained from the decomposition of silicon nitride. From the observation of microstructures and results of properties evaluation, the formation of $TiC_{1-x}N_x$ compound could cause titanium carbide particulates to form irregular shapes, thereby lowering the fracture resistance and thermal resistance at elevated temperature.

To solve the previous problem and maintain the characteristics of high hardness of titanium carbide, the present invention employs a simple system which includes the combination of a simple chemical vaporizing apparatuses with other simple devices, to deposit a layer of titanium nitride ($Ti_3N_4$) onto the surface of titanium carbide particulates. This technique successfully prevents the unwanted reactions that may occur between titanium carbide and silicon nitride based ceramics. In the last decade, the popular direction of developing composite ceramics was to deposit a layer of inorganic material onto the surface of ceramic powder aggregates, so the characteristics could be modified. One of those techniques used in such development was "rotary powder bed chemical vapor deposition", which was revealed by Itaho, H. in *J. Material Science* (1989, volume 24, pages 3643 to 3646). Another technique used in this approach was FBCVD (Fluidized bed chemical vapor deposition), which was revealed by Tsungeki, K in 1993 *J. Material Science* (volumes 28, from page 3168 to 3172).

Since titanium nitride has a high heat expansion constant, high hardness, excellent electrical conductivity, together with high chemical and thermal stability at an elevated temperature, its main applications are for cutting tools and abrasive resistant materials. Therefore, it may be a good additive for composites. Besides, in the sintering process, the contact with silicon nitride is an inert reaction. According to Smith A. et al. revealed in 1994 *Key Engineering Materials* (volumes 89–91, from pages 423 to 428), no reaction was found for the application of titanium nitride in the preparation of silicon nitride based ceramics, even if the temperature was over 1800° C. This result indicated titanium nitride was an excellent additive. Therefore, addition of coated particulates (formed by deposition of titanium nitride to titanium carbide) to silicon based ceramics not only avoids chemical reactions between titanium carbide and silicon nitride, but also elevates the density of sintered bodies. The final product also combines both merits of titanium nitride, and titanium carbide. Moreover, the purpose of improving the mechanical properties of silicon based ceramics has also been achieved.

To deposit titanium nitride onto the surface of titanium carbide powder by chemical vapor deposition technique, as mentioned in the previous paragraph, either rotary powder bed chemical vapor deposition or fluidized bed chemical vapor deposition (FBCVD) can be used. However, both methods require expensive apparatus.

The first purpose of the present invention is to employ a simple "chemical vapor deposition" method that is suitable for mass production. The second purpose of the present invention is to allow titanium nitride deposited onto the surface of titanium carbide, and to prevent chemical reactions between titanium carbide and silicon nitride, therefore, the density and mechanical properties of the final product titanium carbide/silicon nitride composites were enhanced.

SUMMARY OF THE INVENTION

The present invention employs a simple systems which involves the "tube chemical vapor deposition" technique. This system includes a TCVD (tube chemical vapor deposition) reactor, reaction gases, sintering apparatus, heating device and controller, and gas flow controller. During the process of preparation, titanium carbide powder was placed in an aluminum oxide crucible, then the crucible was placed in the tube chemical vapor deposition reactor, the temperature was set between 900° to 1200° C., under total pressure of 1 atm. Reaction gases of titanium chloride ($TiCl_4$), nitrogen ($N_2$), hydrogen ($H_2$) were introduced to the reaction chamber, and the temperature was maintained for 1 to 2 hours to allow deposition of titanium nitride onto the titanium carbide powder. In the process of tube chemical vapor deposition, the formation of titanium nitride became slow if the temperature was below 900° C. Similarly, the deposited layer formed unevenly if the temperature went above 1200° C., owing to the abrupt increase of reaction rate. The amount in gas flow for titanium chloride, nitrogen, hydrogen could also affect the crystal shape formed in titanium nitride deposited layer. In general, any mixing ratio of titanium chloride, nitrogen, hydrogen all produced titanium nitride composite layer. However, the optimal range was 15 to 5 cc/min. of titanium chloride, 300 to 250 cc/min. of nitrogen, and 300 to 250 cc/min. of hydrogen. The present invention "silicon based composite material" adopted the reaction condition as follows: 8 cc/min. of titanium chloride, 270 cc/min. of nitrogen gas, 290 cc/min. of hydrogen gases, and temperature was maintained for 1 to 2 hours. This is the better reaction condition.

The thickness of deposited layer is related to the length of temperature maintained. If the time length of temperature is maintained too short, the deposited layer is not evenly formed, and the reaction between titanium carbide and silicon nitride is not able to be prevented. If the length of temperature is maintained too long, there will be excess heat residual force left. When a constant temperature is maintained for 1 to 2 hours, the thickness of the deposited layer is 1 to 2 μm, which is an optimal thickness. Addition of titaniumcarbide-titanium nitride particulates to silicon nitride based ceramics may result in changes in microstructure, density, hardness, bend strength, fractures properties. These effects are shown in FIG. 4 to 9. Results indicated that deposition of titanium nitride on the surface of titanium carbide in titanium carbide/silicon nitride composite materials exhibited superior characteristics than untreated titanium carbide/silicon nitride.

BRIEF DESCRIPTION OF THE DRAWINGS

FIG. 1. Tube chemical vapor deposition system
  1. nitrogen gas
  2. hydrogen gas
  3. heating chamber
  4. control valve
  5. heating wall reaction chamber
  6. temperature control
  7. power controller
  8. pump
  9. sodium hydroxide tower
  10. exhausting gas hole
  11. isolater FIG. 2. X-ray pictures of coated titanium nitride and uncoated titanium carbide
  (a) surface of titanium carbide coated with titanium nitride
  (b) original appearance of titanium carbide powder
    1. titanium nitride (TiN)
    2. titanium carbide (TiC)

FIG. 3. The appearance and cross-section of additive powder
  (a) the appearance of original titanium carbide
  (b) the surface of titanium carbide powder coated with titanium nitride
  (c) the cross-section look of titanium carbide powder coated with titanium nitride
    1. titanium nitride (TiN)
    2. titanium carbide (TiC)
    3. resin FIG. 4. Microscopic pictures of original composites of titanium carbide/silicon nitride (TiC/$Si_3N_4$)
  (a) a picture of scanning electron microscopy (SEM) examination
  (b) the distribution of composites FIG. 5. Titanium carbide (TiC) coated with titanium nitride ($Ti_3N_4$)
  (a) picture of scanning electron microscopy (SEM) examination
  (b) the distribution of composites FIG. 6. The ratio of porosity upon 1 hour heating of different volume of titanium carbide (TiC) at 1800° C. under helium gas
  1. original titanium carbide/silicon nitride (TiC/$Si_3N_4$)
  2. coated titanium carbide/silicon nitride (TiC/$Si_3N_4$)

DESCRIPTION OF THE PREFERRED EMBODIMENTS

At the present time, the use of the second phase particulates to strengthen ceramic composite materials is the most direct and efficient approach. The key problem of composite materials is in the sintering process, the second phase particulates may react with base material, causing pores on the interface, resulting in sintered bodies with low densities, and the mechanical properties are also affected. The present invention employs a simple technique and apparatus to prepare silicon nitride based composite materials with a uniform deposited layer, and this method is suitable for mass production.

The present invention employs a simple system which involves the "tube chemical vapor deposition" technique to prepare titanium carbide/silicon nitride composites. This system includes a TCVD (tube chemical vapor deposition) reactor, reaction gases, sintering apparatus, heating device and controller, and gas flow controller. The preferred amount of gas flow for the present invention was as follows: 8 cc/min. of titanium chloride, 270 cc/min. of nitrogen gas, 290 cc/min. of hydrogen gases, and the temperature was maintained for 1 to 2 hours. This is the better reaction condition.

EXAMPLE 1

Figure 1:
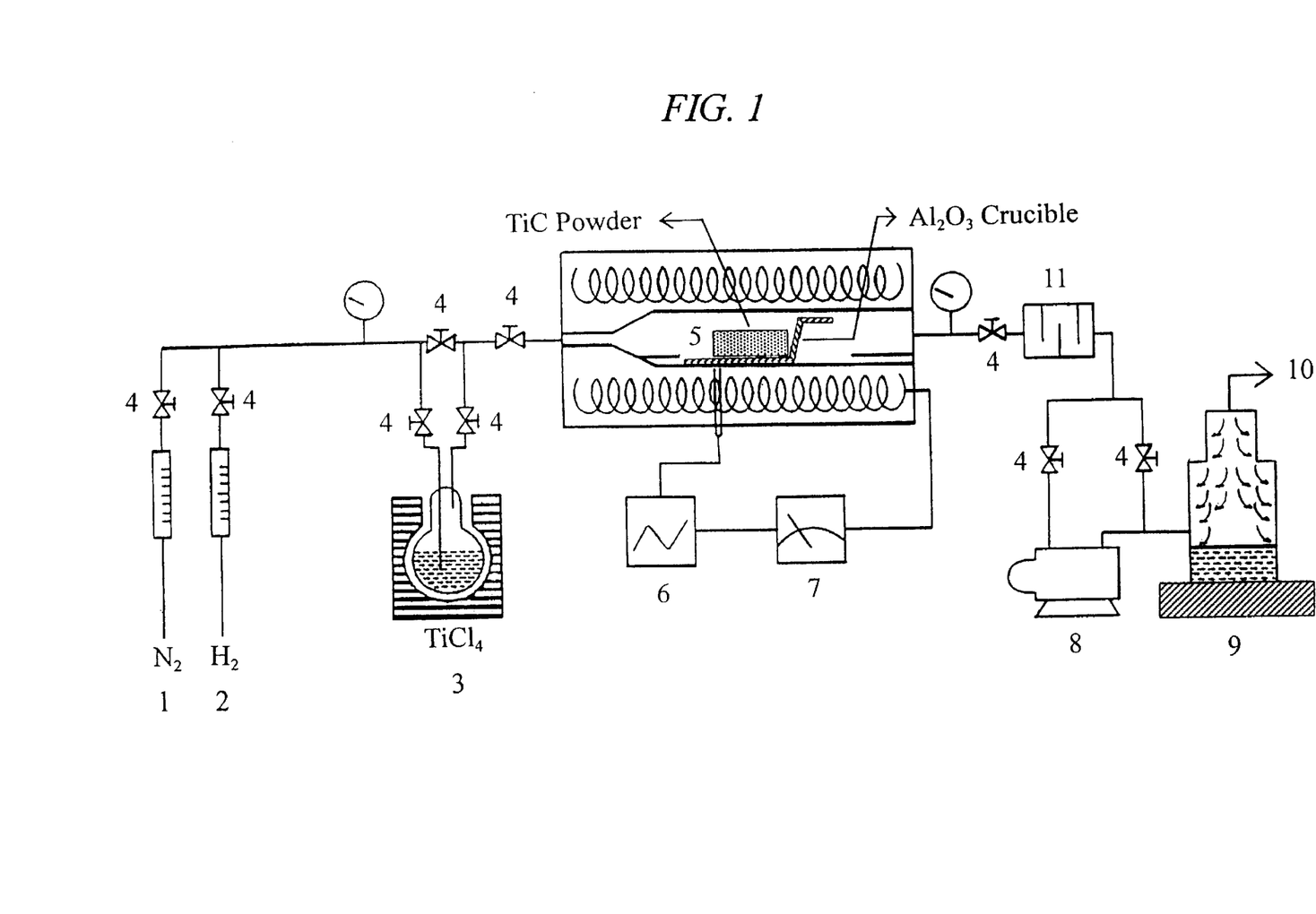

Deposition of titanium nitride onto titanium carbide powder by tube chemical deposition technique Each batch of 3 grams of titanium carbide (Cerac Inc. grade T-1251) was placed uniformly in a aluminum oxide crucible, and the crucible was transferred to the reaction chamber as shown in FIG. 1. At temperature 1050° C., and under a total pressure of 1 atm, titanium chloride was introduced at a rate of 8 cc/min., reaction gas flow of nitrogen gas was at 270 cc/min., hydrogen gas was at 290 cc/min., and the temperature was maintained for one and half hours to allow deposition of titanium nitride onto titanium carbide powder. The coated powder was ground in aluminum oxide mortar, then passed through a 325 mesh sieve. The X-ray diffraction pictures and microstructures of untreated and treated powder are shown in FIG. 2 and FIG. 3.

As mentioned previously, methods for deposition of titanium carbide on metals or ceramic powder could use methods such as rotary powder chemical deposition, fluid bed chemical deposition, etc. However, these methods require expensive equipment. On the contrary, the present method is to use a traditional tubular heating reactor, equipped with some reaction gas flow controlling valves. Apparently, the operation is easy and the cost is greatly reduced. The modified tube chemical gas deposition reactor is shown in FIG. 1.

Figure 2:
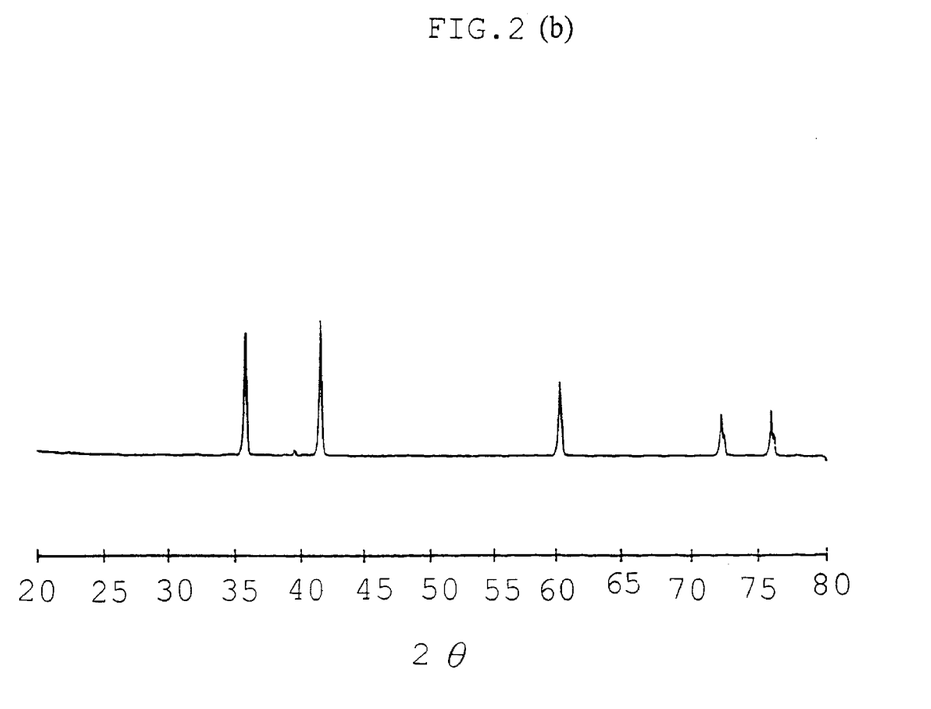
Figure 2A:
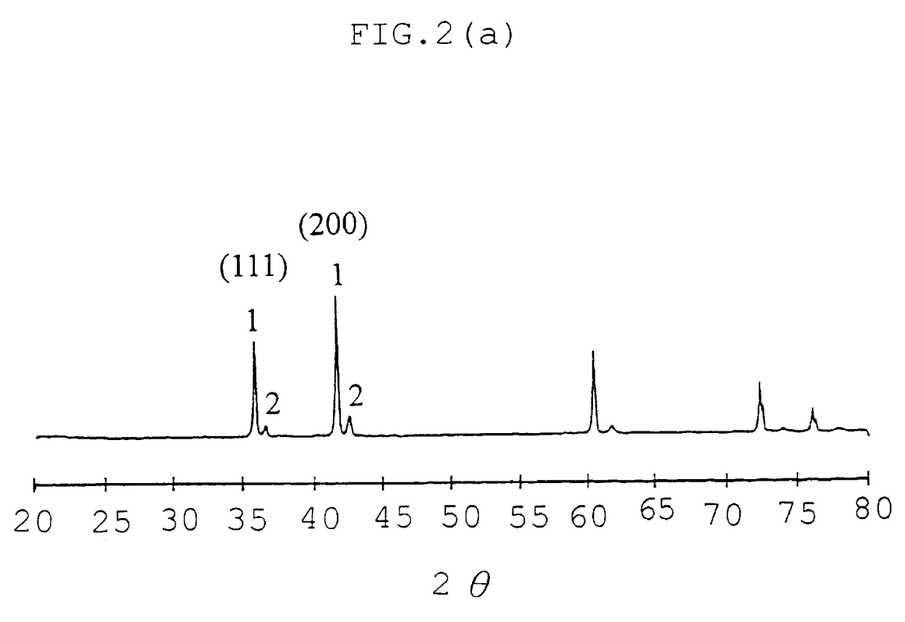
Figure 3:
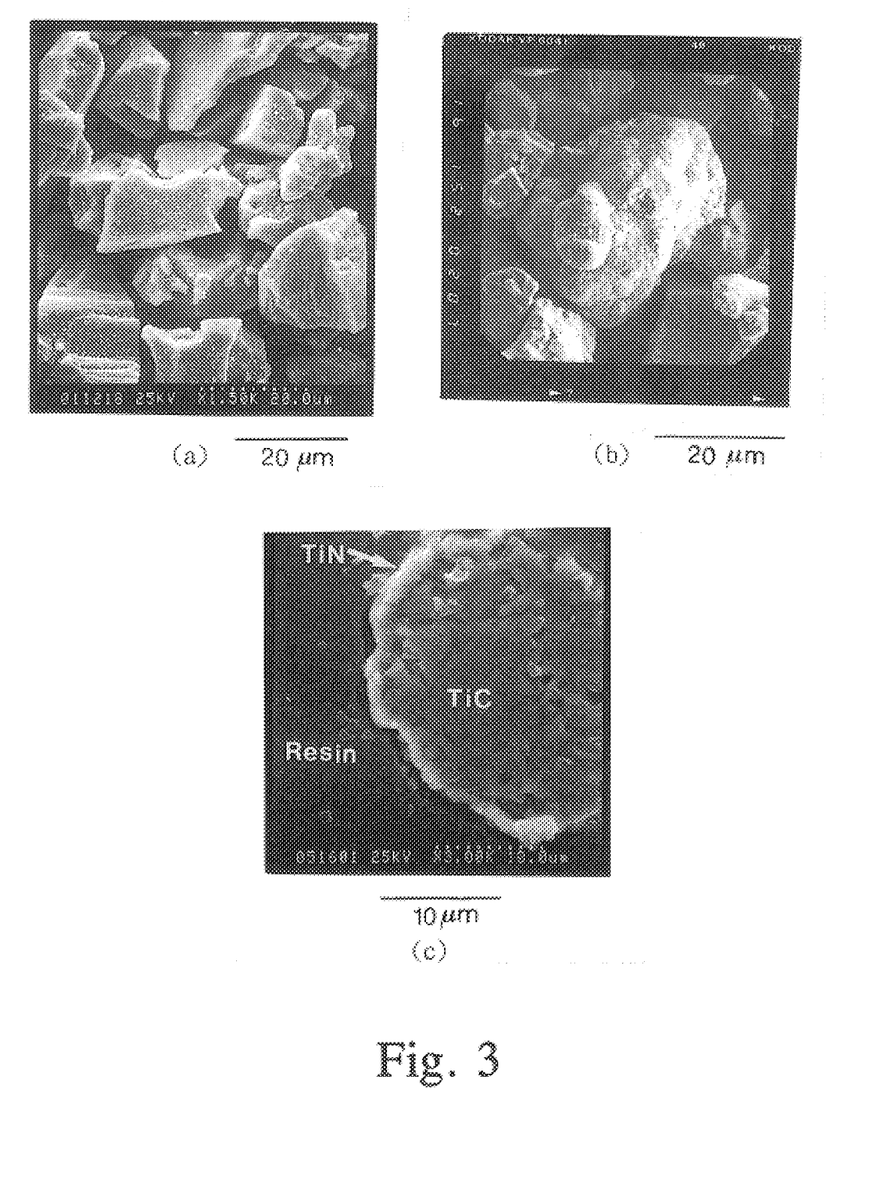

As shown in FIG. 2, by utilizing the apparatus in FIG. 1, titanium nitride was indeed deposited on the surface of titanium carbide. A picture of the scanning electron microscopy (SEM) examination is shown in FIG. 3. The picture indicated that the surface of titanium carbide powder was covered by titanium nitride, because the shape of treated powder was more smooth than the untreated powder. The smooth shape facilitates the flow and deposition of powder. From (c) of FIG. 3, titanium carbide powder treated with tube CVD had a layer of about 1 $\mu$m of titanium nitride.

EXAMPLE 2

Preparation titanium carbide/silicon nitride composites using titanium carbide particulates coated with titanium nitride This procedure adopted powder specifications in FIG. 1. First of all, a powder mixture of 92 wt. % $Si_3N_4$, 6 wt. % $Y_2O_3$ and 2 wt. % $Al_2O_3$ was ground with 5 mm and 10 mm ball mills, with addition of absolute alcohol at a weight ratio of 1:3 for 22 hours, and aggregates were then dried under vacuum.

Strengthened powder (includes pure titanium carbide, and coated titanium carbide from example 1) was mixed with previous mentioned silicon nitride at ratios of 10 vol. %, 20 vol. %, and 30 vol. %, and then was ground for 2 hours in a ball mill. The ground powder was dried in a rotating condenser to be used as the starting powder. The starting powder was placed into a stainless mold with 5 cm inner diameter. Under a pressure of 10 MPa, a slug was formed upon compression.

Figure 10:
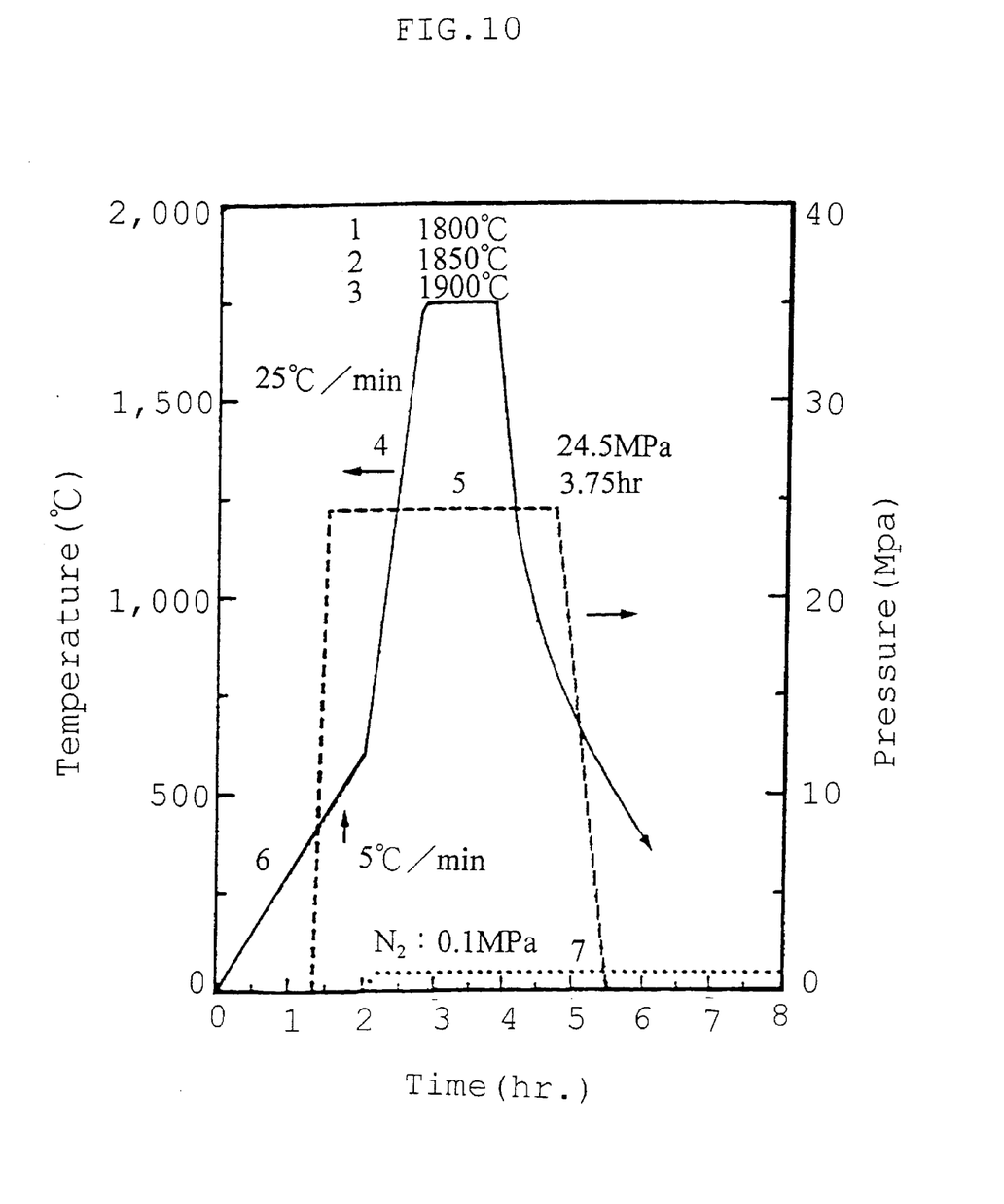
FIG. 10. Hot-pressed processes at different temperatures and pressures
  1. 1,800° C.
  2. 1,850° C.
  3. 1,900° C.
  4. 25° C./minute
  5. 24.5 MPa, 3.75 hours
  6. 5° C./minute
  7. nitrogen gas, 0.1 MPa

The slug was placed in a graphite mold which was coated with a layer of boron carbide, and the mold was then placed in the hot-pressed furnace. The rising curve of temperature is shown in as FIG. 10. During the hot-pressed period, the mechanical pressure was 24.5 MPa, and 1 atm of nitrogen gas was passed to avoid decomposition of silicon nitride occurring at high temperature. The pressure and nitrogen gas curves were shown in FIG. 10.

Figure 4:
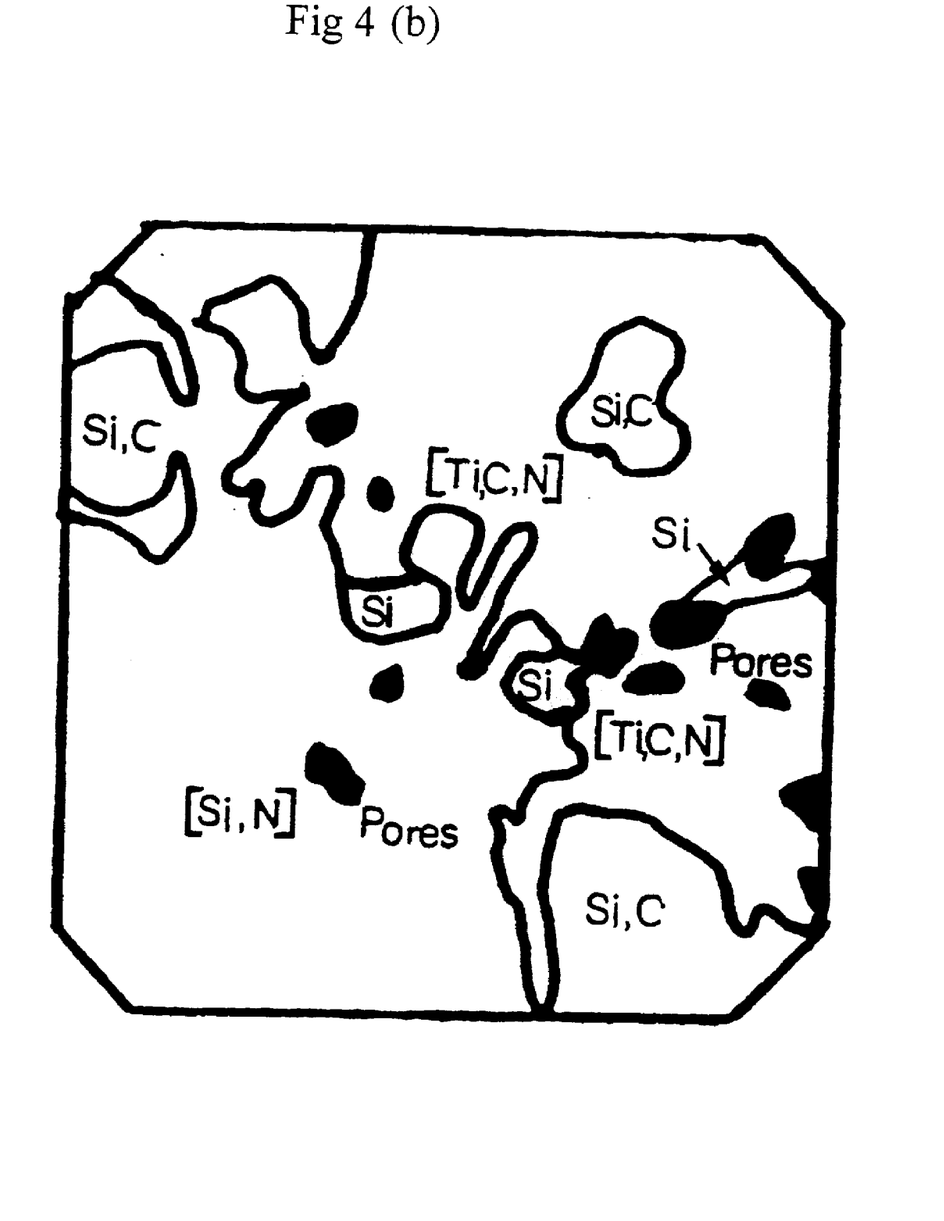
Figure 4A:
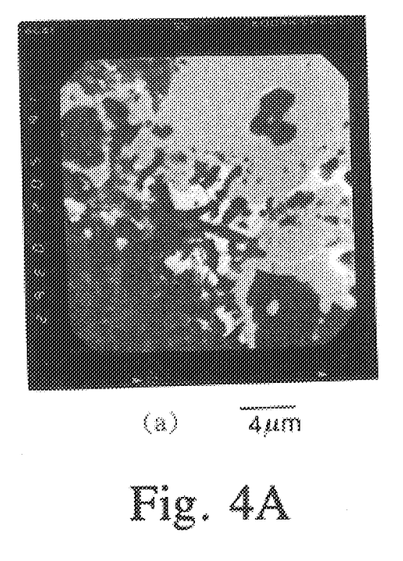
Figure 5A:
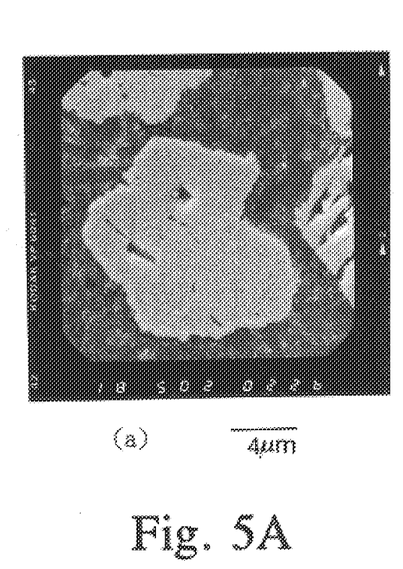
Figure 5B:
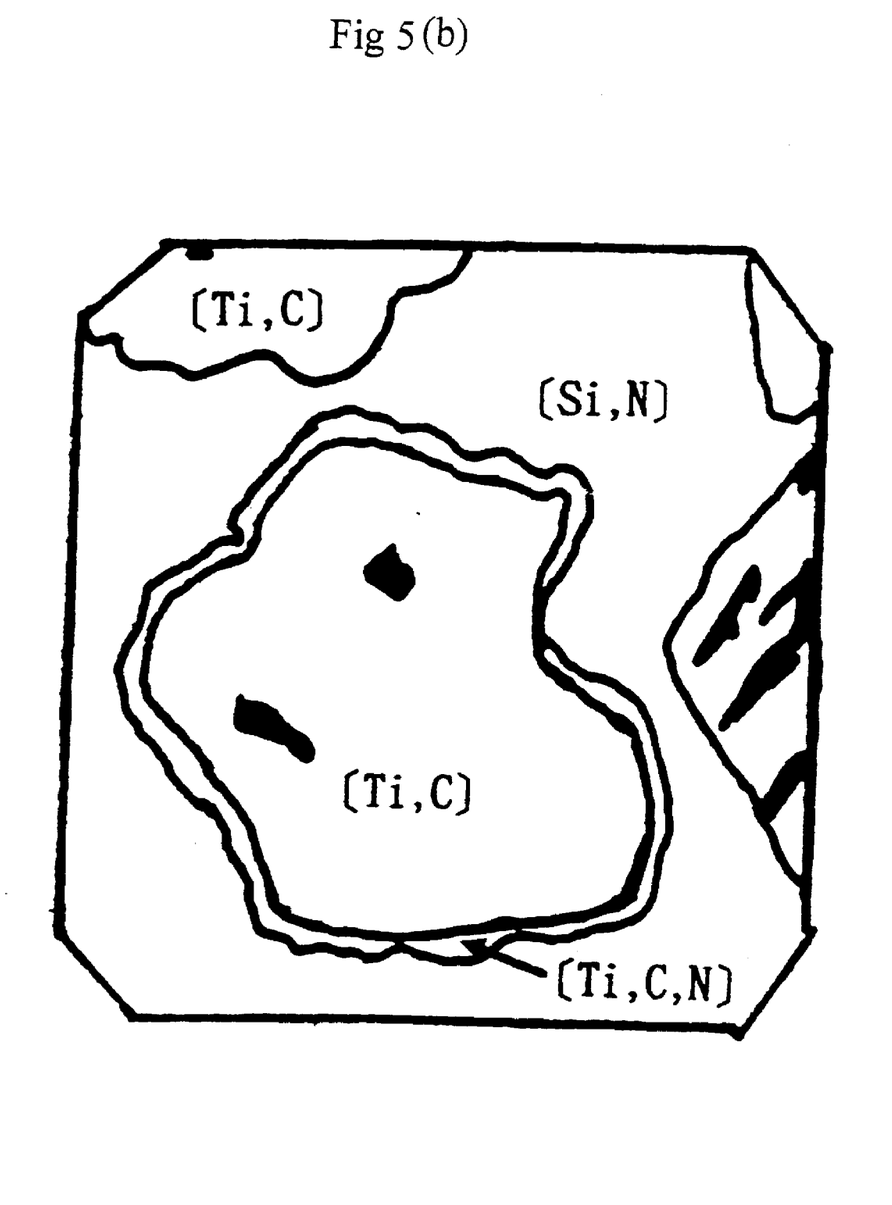

Upon being hot-pressed, the micro structures of sintered bodies were shown in FIG. 4 and FIG. 5. In the preparation of titanium carbide/silicon nitride composite, a chemical reaction could occur between titanium carbide and silicon nitride. Compounds of titanium, carbon, nitrogen could be formed, and left pores in the interface. However, when titanium carbide coated with titanium nitride particulates were added to the surface of silicon nitride powder, the interface between titanium carbide and silicon nitride did not show pores, owing to the earlier reaction between titanium nitride and titanium carbide, and the formation of titanium, carbon and nitrogen compounds. As a result, the chemical reaction between titanium carbide and silicon nitride was avoided.

Results of measurement (1) the ratio of open porosity

The ratio of open porosity was measured using the following equations:

$$f_{op} = \frac{Ww - Wd}{Ww - Ws}$$

$f_{op}$ was the ratio of open porosity, $W_w$ was the weight of test piece with water layer, $W_d$ was the dry weight of test piece, $W_s$ was the weight of test piece suspended in water.

Figure 6:
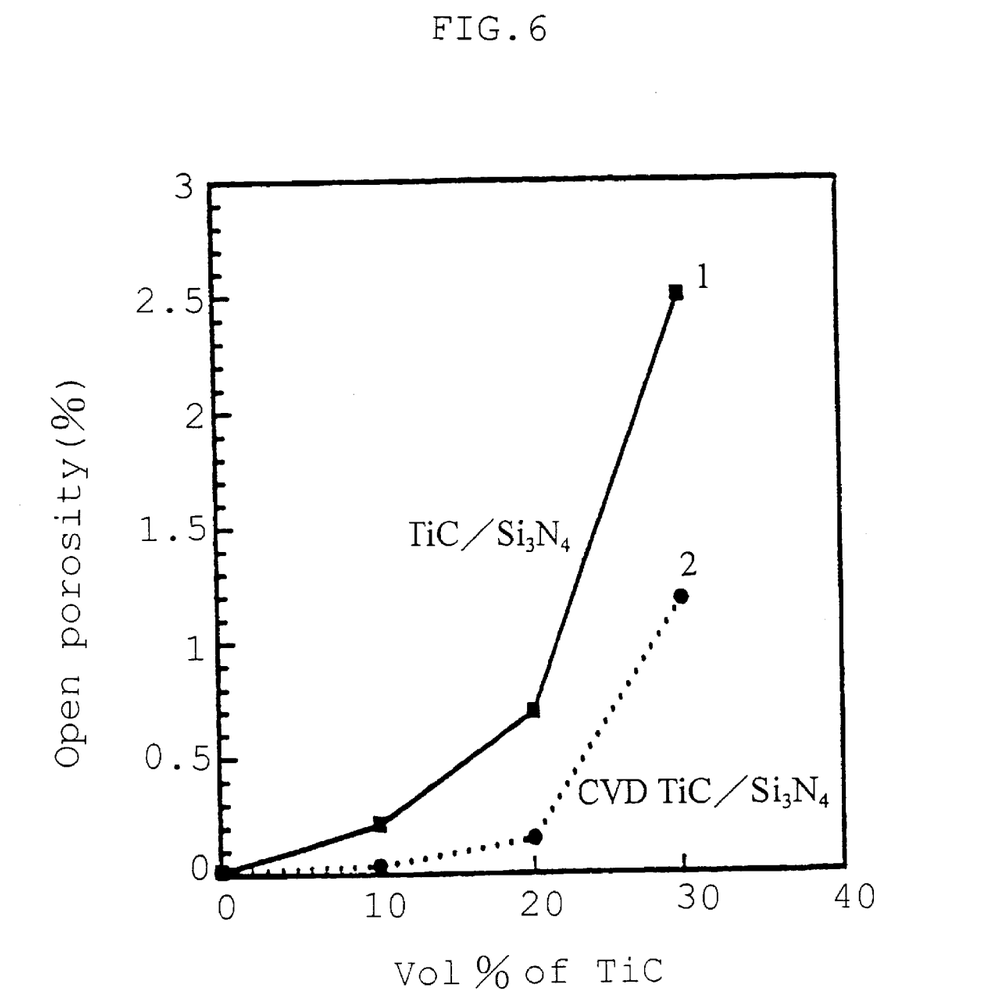

The result is shown in FIG. 6, the ratio of pore porosity of titanium carbide/silicon nitride composites coated with titanium nitride was about 1 to 2% lower than uncoated titanium carbide/silicon nitride.

(2) Measurement the strength of bending

The preparation of powder in the present example was the same as in example 1, except the shape of the hot-pressed sample was milled to bars with dimensions of 3×4×45 mm, (3 mm was the height, and the height was vertical to the direction of mechanical force). These bars were polished to 15 $\mu$m before conducting four points bend test. For this test, the loading rate was 0.5 mm/min., the inner diameter was 10 mm, and outer diameter was 30 mm. The bend strength was calculated by the following equation:

$$\sigma(mPa) = \frac{3Fp(L-S)}{2db^2}$$

$F_p$ was the weight loaded

L was outer diameter

Figure 8:
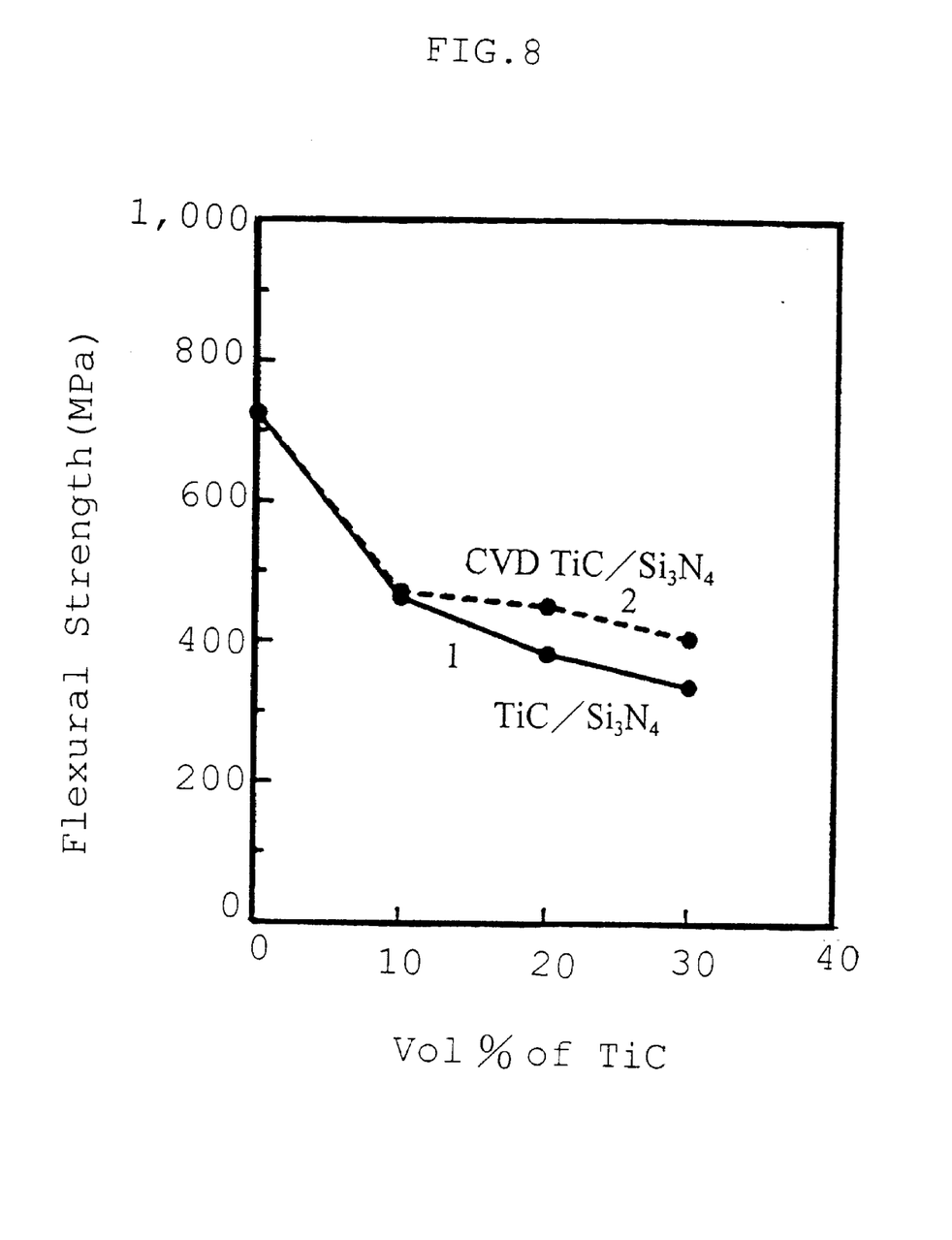
FIG. 8. The change of bend strength upon 1 hour heating of different volume of titanium carbide (TiC) at 1800° C. under helium gas
  1. original titanium carbide/silicon nitride (TiC/$Si_3N_4$)
  2. coated titanium carbide/silicon nitride (TiC/$Si_3N_4$)

S was the inner diameter d was the width of testing bar b was the height of testing bar The result of measurement is shown in FIG. 8, titanium carbide/silicon nitride coated with titanium nitride had a higher value of strength.

(3) Measurement of hardness and fracture toughness

The testing sample in the present test was prepared in the same way as in measurement (2). The testing sample was polished to 1 $\mu$m, and the hardness was then tested with a micro-hardness diamond indented, the diagonal length (2a) and the length of crack (c) was measured. The hardness ($H_v$) and fractures ($K_{ic}$) were calculated by the following equations:

$$Kic = \frac{0.15K \left(\frac{c}{a}\right)^{\frac{3}{2}} \cdot Hv \cdot \sqrt{a}}{\Phi}$$

$$Hv = \frac{2P\sin\left(\frac{\theta}{2}\right)}{d^2}$$

Figure 7:
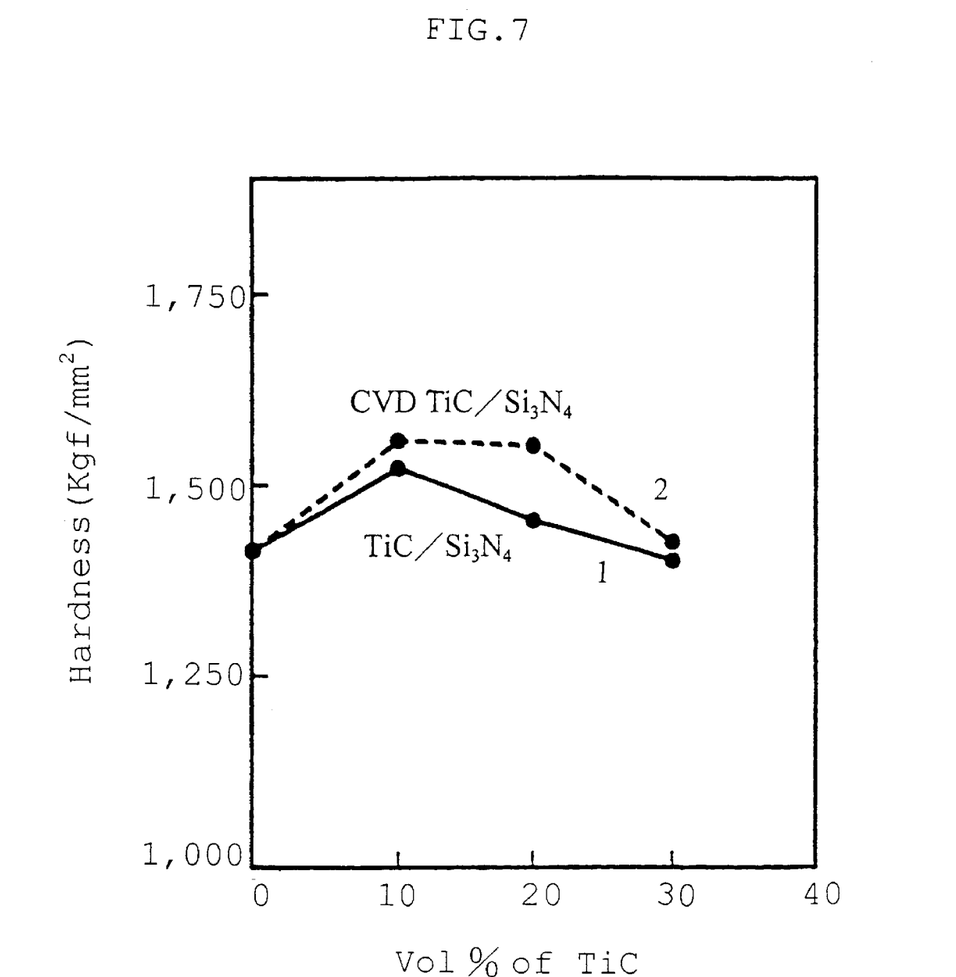
FIG. 7. The change of hardness upon 1 hour heating of different volume of titanium carbide (TiC) at 1800° C. under helium gas
  1. original titanium carbide/silicon nitride (TiC/$Si_3N_4$)
  2. coated titanium carbide/silicon nitride (TiC/$Si_3N_4$)
Figure 9:
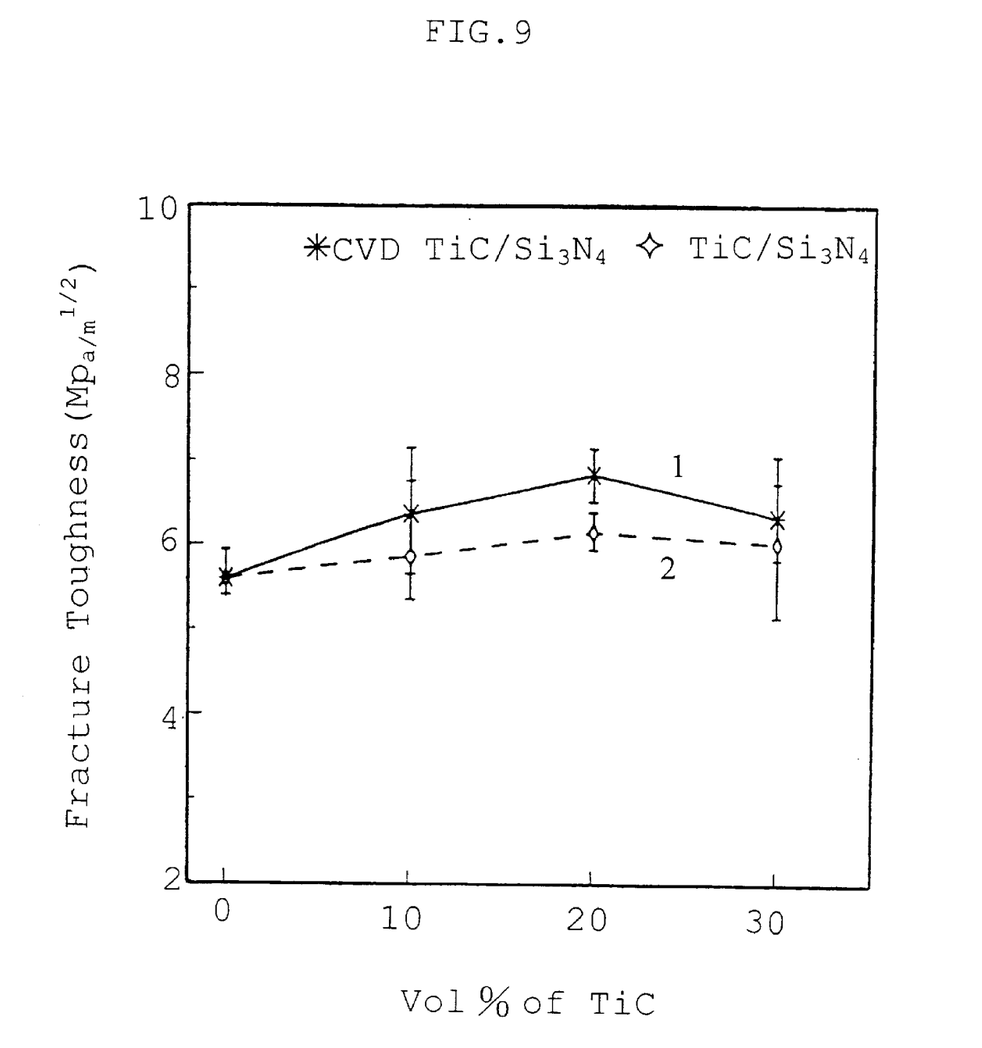
FIG. 9. The change of fractures upon 1 hour heating of different volume of titanium carbide (TiC) at 1800° C. under helium gas
  1. original titanium carbide/silicon nitride (TiC/$Si_3N_4$)
  2. coated titanium carbide/silicon nitride (TiC/$Si_3N_4$)

$\Phi \approx 3$, K was an experienced constant, when c/a>2.5 the, k=3.2 The angle of diamond head in the present example was $\theta = 148°$ Results of measurement are shown in FIGS. 7 and 9. FIG. 7 shows the hardness of coated titanium carbide was higher than uncoated titanium carbide, owing to the hardness of silicon nitride was enhanced. In FIG. 9, the surface of titanium carbide/silicon nitride composites coated with titanium nitride had a higher fracture resistance value.

Table 1. Characteristics of starting powder

TABLE 1

| powder | Manufcturer | Class | Purity | Particle size |
|---|---|---|---|---|
| $Si_3N_4$ | H. C. Stark | LC-12N | >94% α-$Si_3N_4$ | Average 0.6 μm |
| TiC | Cerac | T-1251 | 99.5% | Average > 10 μm |
| $Y_2O_3$ | Molycorp | 5603 | 99.99% | Average 1.8 μm |
| $Al_2O_3$ | Alcoa | 16 SG | 99.97% | Average 0.5 μm |

What we claim is:

1. A method for making titanium carbide/silicon nitride composites using titanium carbide coated with titanium nitride comprising passing a gas including titanium chloride, nitrogen, and hydrogen over a titanium carbide powder in a deposition reaction chamber of a tube chemical gas deposition hot-pressed reactor;

maintaining a temperature in said deposition reaction chamber of from 900° C. to 1200° C.;

maintaining a total pressure of 1 atm in said reaction chamber;

maintaining said deposition reaction chamber at a constant temperature for 1 to 2 hours to form a deposit of titanium nitride on said titanium carbide powder;

mixing said titanium carbide powder having a titanium nitride deposit thereon with silicon nitride to form a mixture; and sintering said mixture to form a titanium carbide/silicon nitride composite.

2. The method as defined in claim 1, wherein said gas flow includes titanium chloride flowing at a rate of 5 to 15 cc/min., nitrogen gas flowing at a rate of 250 to 300 cc/min., and hydrogen gas flowing at a rate of 250 to 300 cc/min.

3. The method as defined in claim 1, wherein a flow rate of titanium chloride is 8 cc/min., a flow rate of nitrogen gas is 270 cc/min., and a flow rate of hydrogen gas is 290 cc/min.

* * * * *